(12) United States Patent
Garnett

(10) Patent No.: US 8,304,825 B2
(45) Date of Patent: Nov. 6, 2012

(54) VERTICAL DISCRETE DEVICES WITH TRENCH CONTACTS AND ASSOCIATED METHODS OF MANUFACTURING

(75) Inventor: Martin E. Garnett, Los Gatos, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 154 days.

(21) Appl. No.: 12/888,273

(22) Filed: Sep. 22, 2010

(65) Prior Publication Data

US 2012/0068231 A1    Mar. 22, 2012

(51) Int. Cl.
 *H01L 27/108* (2006.01)
 *H01L 29/76* (2006.01)
 *H01L 29/94* (2006.01)
 *H01L 31/119* (2006.01)

(52) U.S. Cl. ............... 257/302; 257/335; 257/E27.057; 257/E27.096

(58) Field of Classification Search ......... 257/134, 257/135, 302, 328, 329, 335, 341, E27.057, 257/E27.096
See application file for complete search history.

(56) References Cited

U.S. PATENT DOCUMENTS 7,566,931 B2 * 7/2009 Kocon ............ 257/328

* cited by examiner

*Primary Examiner* — Hoai V Pham
(74) *Attorney, Agent, or Firm* — Perkins Coie LLP

(57) ABSTRACT

The present technology is related generally to vertical discrete devices with a trench at the topside of the vertical discrete devices. The trench is filled with a conducting material. In this approach, a drain or cathode of the vertical discrete devices is electrically connected to the topside to result in a small area with low RON*AREA.

14 Claims, 9 Drawing Sheets

US 8,304,825 B2

VERTICAL DISCRETE DEVICES WITH TRENCH CONTACTS AND ASSOCIATED METHODS OF MANUFACTURING

TECHNICAL FIELD

The present technology relates generally to discrete semiconductor devices, and particularly, relates to vertical discrete semiconductor devices with trench contacts and associated methods of manufacturing.

BACKGROUND

In some analog chip applications, an integrated circuit die may be co-packaged with a discrete device die having Metal Oxide Semiconductor Field Effect Transistors (MOSFET), Junction Field Effect Transistors (JFET), and/or suitable other devices. In some applications, the contact pads of both the integrated circuit die and the discrete device die are on the same side. Lateral devices such as Lateral Double Diffused MOSFET (LDMOS) can easily meet this requirement. However, in many other applications, it may be difficult. For example, discrete devices typically have a requirement on low-on resistance (RON) and a small area. Thus, the parameter RON*AREA is important. Discrete devices such as vertical MOSFET, vertical JFET or Field Effect Transistor (FET) with integrated Schottky diodes can achieve lower cost and much lower RON than LDMOS partly because the drain or the cathode includes the entire back surface of the die. Thus, some applications for such co-packaged products require that the backside drain/cathode of the vertical discrete die contacts the topside surface of the die by a via.

FIG. 1A is a cross-sectional view of a conventional vertical MOSFET 100 as one example in accordance with the prior art. The MOSFET device 100 comprises a highly doped N+ substrate 10 at the bottom side as the drain. At the topside, gate regions 12, P type body regions 13 and N type source regions 11 are fabricated in the N– epitaxial layer 15. In the embodiment shown in FIG. 1A, the gate regions 12 are formed by trenches in the N– epitaxial layer 15 filled with polysilicon. Around the sidewalls of the trenched gate regions 12, gate oxide 120 is aligned to separate the gate regions 12 from the P type body regions 13 and the N– epitaxial layer 15. The N+ source regions 11 are formed in the body regions 13 from the topside surface and are adjacent to the gate oxide 120 of the gate regions 12.

The source regions 11 are connected together by electrically conducting interconnection 111 and are connected electrically to source contact pad/pads 1110 to form the source electrode S. The gate regions 12 are connected together by electrically conducting interconnection (not shown in this section) and are connected electrically to the gate contact pad/pads to form the gate electrode G. A metal layer contacted to the entire back side of the substrate 10 functions as the drain electrode D. In one embodiment, the electrically conducting interconnections and the contact pads are made of metal such as copper. The source regions 11 and the body regions 13 are shorted. As shown in FIG. 1A, trench/trenches 112 are among the N+ source regions 11 and reach into the P body regions 13, then metal is deposited in the trenches 112 to form the contacts and source interconnections 111. The body regions 13 and the source regions 11 are electrically shorted and led out to the source contact pads 1110 by the source interconnections 111.

In other conventional devices, the source regions 11 and the body regions 13 are shorted through an extended source contact as shown in FIG. 1B. In this approach, the source interconnections 111B have an extended contact area and electrically contact both the source region 11 and the body region 13. P+ body contact regions 131 above the P body regions 13 and the source regions 11 are formed optionally to short the source regions 11 and the body regions 13, as shown in FIG. 1C. However, the cell area will be larger than the embodiment in FIG. 1A due to the large contact required for a P+ body contact region.

FIG. 2 shows a topside view of a conventional discrete vertical device 200 in accordance with the prior art. From the topside surface, source plate 21 and gate plate 22 are laid out. The source plate 21 contacts the topside source regions of a vertical device through interconnection. In one embodiment the source plate forms part of the interconnection structure. The gate plate 22 contacts the topside gate regions of the vertical device through interconnection. On the source plate 21, source contact pads 211 are formed. Also, gate contact pad/pads 221 are formed on the gate plate 22.

As such, the gate and the source of the vertical device are electrically isolated by separated gate plate and source plate. The drain/cathode of the vertical device is on the backside substrate of the discrete device die 200 and the drain plate is laid out at the bottom surface of the discrete device die 200. In a typical device, the whole bottom surface is covered with a metal as the drain.

DETAILED DESCRIPTION

Various embodiments of vertical semiconductor devices with topside contacts and associated methods of manufacturing are described below. As used hereinafter, the term "vertical semiconductor device" generally refers to MOSFET, JFET, FET, Double Diffused MOSFET (VDMOS), and/or other suitable semiconductor devices. A person skilled in the relevant art will also understand that the technology may have additional embodiments, and that the technology may be practiced without several of the details of the embodiments described below with reference to FIGS. 3-7E.

Figure 3:
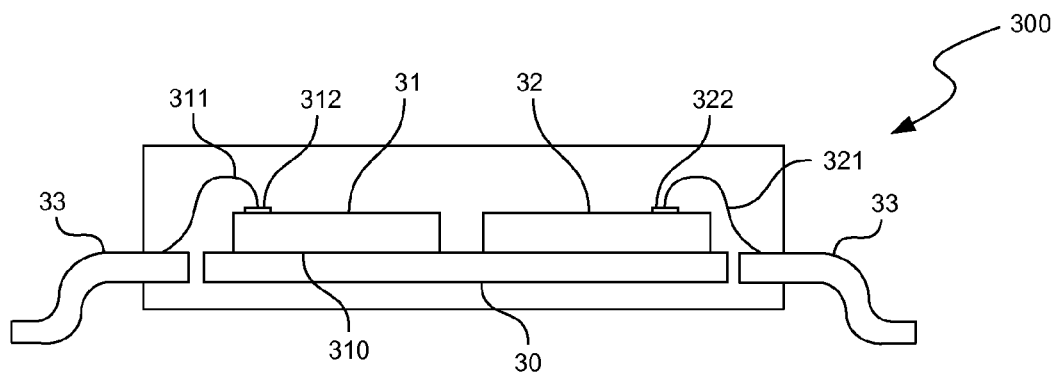
FIG. 3 illustrates a multi-die package in accordance with embodiments of the present technology.

FIG. 3 shows a multi-die package 300 in accordance with embodiments of the present technology. As shown in FIG. 3, the package 300 includes a discrete vertical device die 31 co-packaged with an integrated circuit die 32. In one embodiment, the vertical device die 31 includes a power discrete device die such as VDMOS or vertical JFET. The integrated circuit die 32 can include a controller for controlling the on and off of the power discrete circuit 31. The bottom surface 310 of the vertical device die 31 functions as the drain/cathode.

The drain/cathode contact pad/pads 312 for drain/cathode electrode, the source contact pad/pads for source electrode and the gate contact pad/pads for gate electrode of the vertical device die 31 are formed on the same surface referred to as the topside surface. In order to form the drain contact pad 312 on the topside surface while keeping low RON for the vertical device die 31, the drain/cathode of the vertical device is electrically connected to the topside surface through trench/trenches filled with conducting material such as tungsten.

With this trench contacted topside drain, the vertical device die 31 and the integrated circuit die 32 are attached onto a lead frame 30 and are connected to the leads 33 through wire bonding at the same side as seen in FIG. 3. In one embodiment, the backside substrate of the vertical device die 31 is electrically isolated from the paddle 30 of the lead frame, for example by placing a dielectric material between the backside substrate of the vertical device die 31 and the paddle 30. In this way, the power discrete circuit 31 and the integrated circuit die 32 can be placed on the same paddle 30, and if a power supply is needed for the integrated circuit die 32 and the drain of the discrete device die 31, it is simple and inexpensive to bring a power supply to the top surface for the integrated circuit die 32 and to the backside surface for the power discrete device die 31. The topside drain contact pad 312 of the vertical device die 31 and the contact pad 322 of the integrated circuit die 32 are connected to the lead 33 through wire bonding 311 and 321.

Figure 1A:
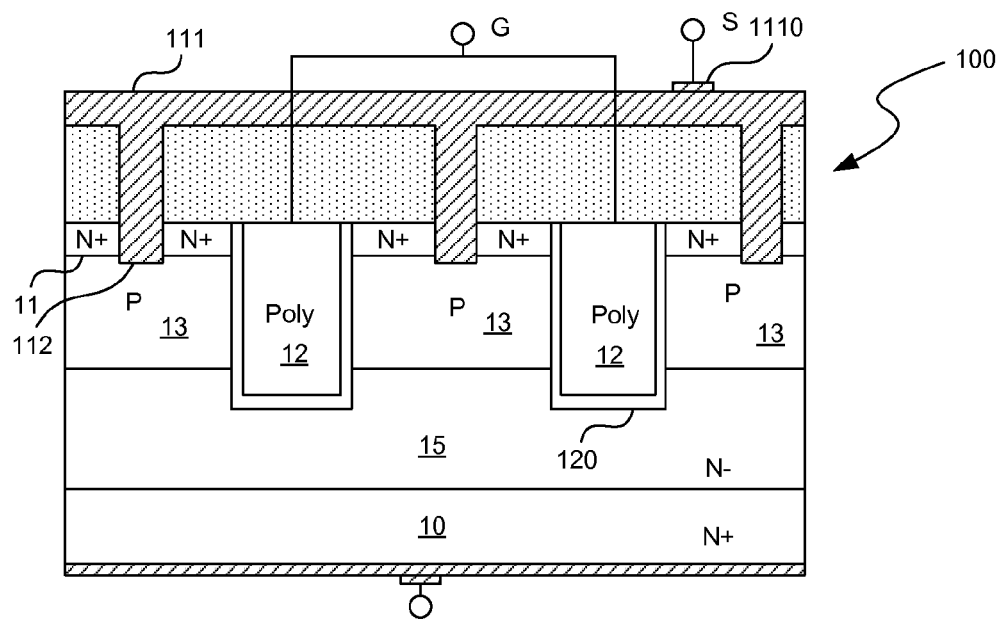
FIGS. 1A-1C illustrates conventional vertical MOSFET in accordance with the prior art.
Figure 4A:
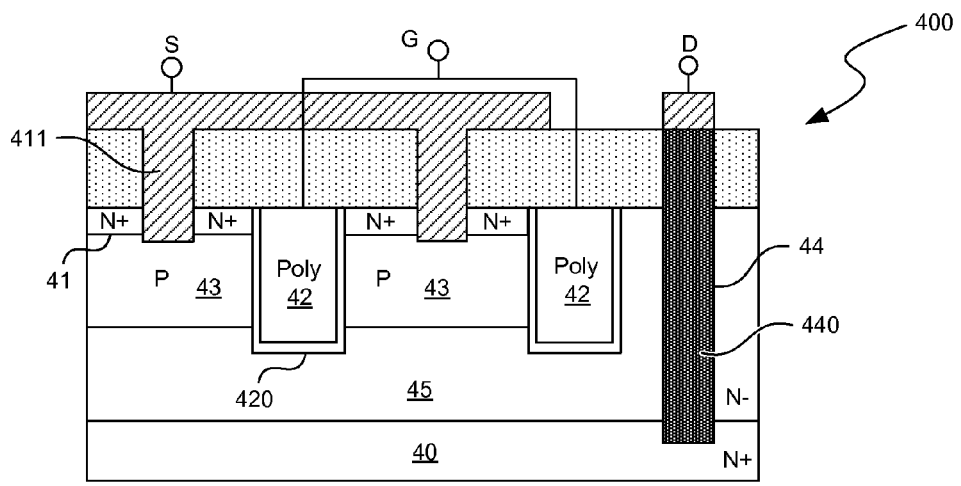
FIG. 4A illustrates a cross-sectional view of a vertical MOSFET with trench contacts in accordance with embodiments of the present technology.

FIG. 4A illustrates a cross-sectional view of a vertical MOSFET 400 with trench contacts in accordance with embodiments of the present technology. Compared to the vertical MOSFET 100 shown in FIG. 1A, the vertical MOSFET 400 further comprises a trench or trenches 44 filled with a conducting material 440 that connects the substrate 40 to the topside. Thus, the drain electrode D is converted from the back side to the topside.

In the illustrated embodiment, the vertical MOSFET 400 is configured as a VDMOS with a backside substrate 40. The backside substrate 40 is highly N type doped and functions as the drain of the VDMOS. Above the N+ substrate 40, an N− epitaxial layer 45 is formed. In the N− epitaxial layer 45, the body regions 43, source regions 41 and gate regions 42 are formed from the topside surface.

In one embodiment, in the N− epitaxial layer 45, trenches for gate regions 42 are made, gate oxide 420 is formed at the sidewalls and the bottom of the trenches and polysilicon is then filled in the trenches to form the gate regions 42. Besides the gate regions 42, P type body regions 43 are formed adjacent to the gate oxide 420 of the gate regions 42. Then source regions 41 are formed into the body region 43 on the topside.

Figure 1B:
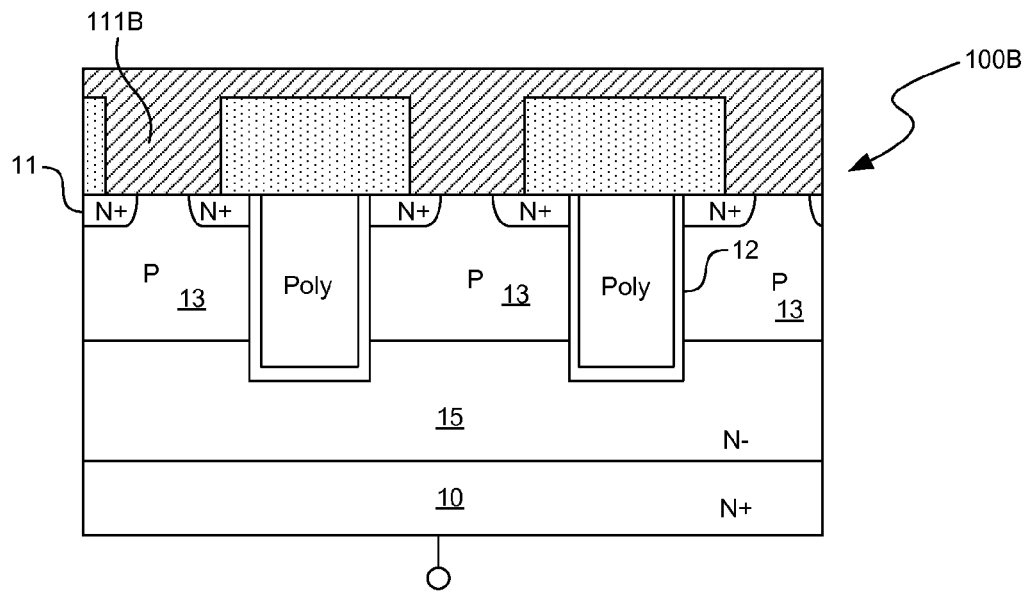
Figure 1C:
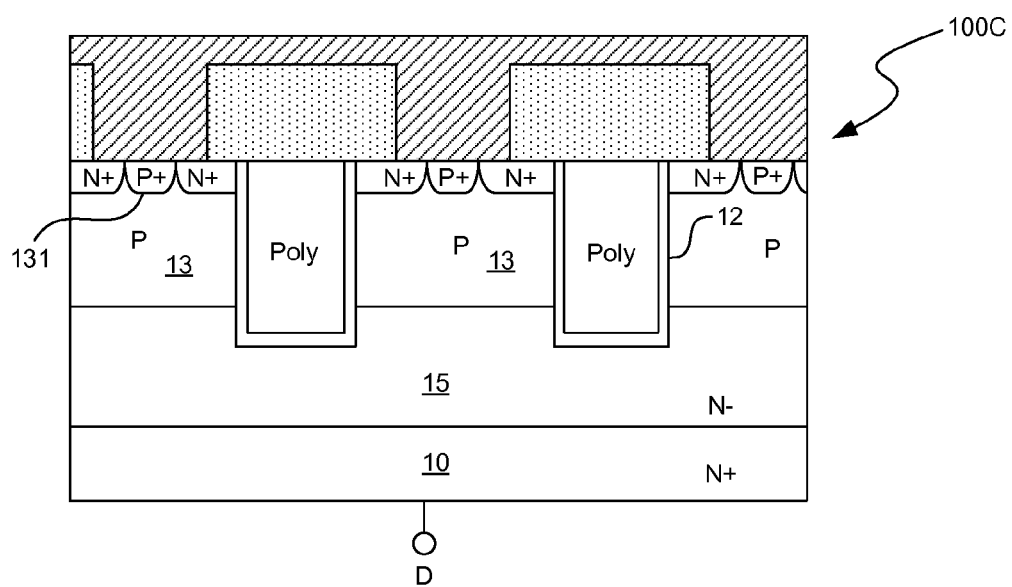

The body regions 43 and the source regions 41 are shorted in one embodiment through contacts extending through the source regions 41 and into the body regions 42 and filled with a metal, forming source interconnections 411. In another embodiment, the body region 43 and a source region 41 are shorted through extended contact as shown in FIG. 1B or FIG. 1C.

The source regions 41 are electrically led out through the conducting interconnections 411 as the source electrode S. And the gate regions 42 are also electrically led out by the conducting interconnections (not shown) as the gate electrodes G. When the gate region 42 is activated with a high gate voltage, the P body region 43 near the gate region 42 is inverted to N type, and an N type channel is formed. When a positive source to drain voltage VSD is applied, current flows from the source 41 through the channel to the N+ drain 40.

Continuing with FIG. 4A, the vertical MOSFET 400 further comprises trench/trenches 44 which extend from the top surface into the N+ substrate 40. The trench 44 is filled with a conducting material which connects the drain 40 of the vertical MOSFET 400 to the topside surface of the vertical MOSFET 400. In one embodiment, the conducting material is tungsten 440 and the drain of the substrate 40 is connected to the topside surface through tungsten 440.

Figure 4B:
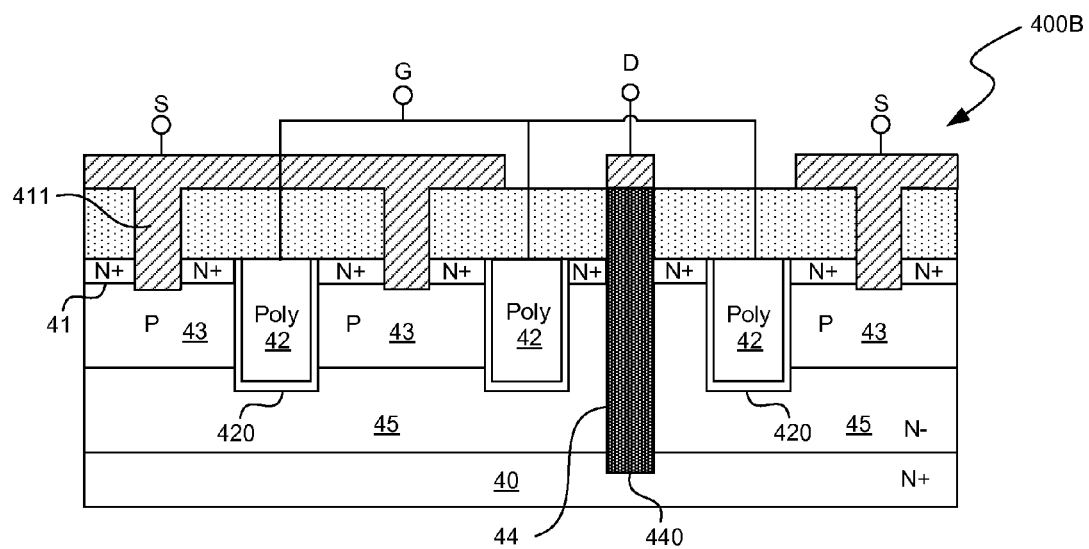
FIG. 4B illustrates a cross-sectional view of a vertical MOSFET with trench contacts in accordance with additional embodiments of the present technology.

In one embodiment, the trench 44 is made in the N+ regions and between two gate regions 42 for the semiconductor device 400B as shown in FIG. 4B. For this embodiment, the masks used in photolithography for manufacturing the source regions 41 and gate regions 42 of the semiconductor device 400B can share the same masks of the vertical MOSFET 100 in FIG. 1A.

The trench 44 made for connecting the substrate 40 and the topside surface can be narrow. The depth of the trench 44 is partly determined by the breakdown voltage of the vertical MOSFET 400. In one example, for a vertical MOSFET with 30V breakdown voltage, the etch depth is in 2-3 micrometers range and the width is in 0.5 to 1 micrometers range. Though the substrate 40 can be connected to the topside surface of the vertical MOSFET 400 through deep diffusion of highly N type dopant, the diffusion solution leads to a large contact area partly because of the lateral diffusion effect. Because of the small width, low resistance, and no lateral diffusion of the tungsten filled trench 44 compared to a deep diffusion solution, the area required to contact the N+ substrate drain is significantly smaller.

The vertical discrete device in FIG. 4A uses a trench gate DMOS device as an example. However, other vertical devices such as conventional VDMOS with thin film gate, vertical JFET, vertical FET with Schottky diode or any device with the substrate drain/cathode are also applicable to the present technology with trench contacted topside drain/cathode.

Figure 5A:
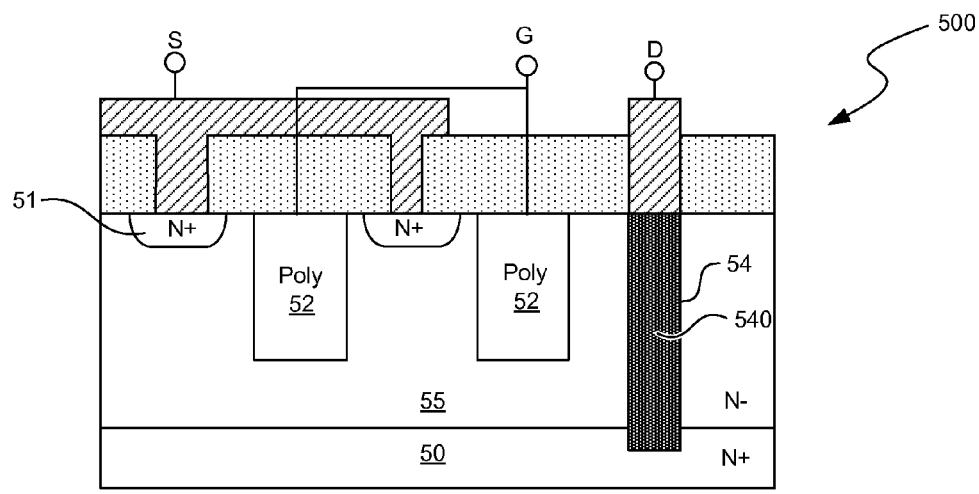
FIG. 5A illustrates a cross-sectional view of a JFET with trench contacts in accordance with additional embodiments of the present technology.
Figure 5B:
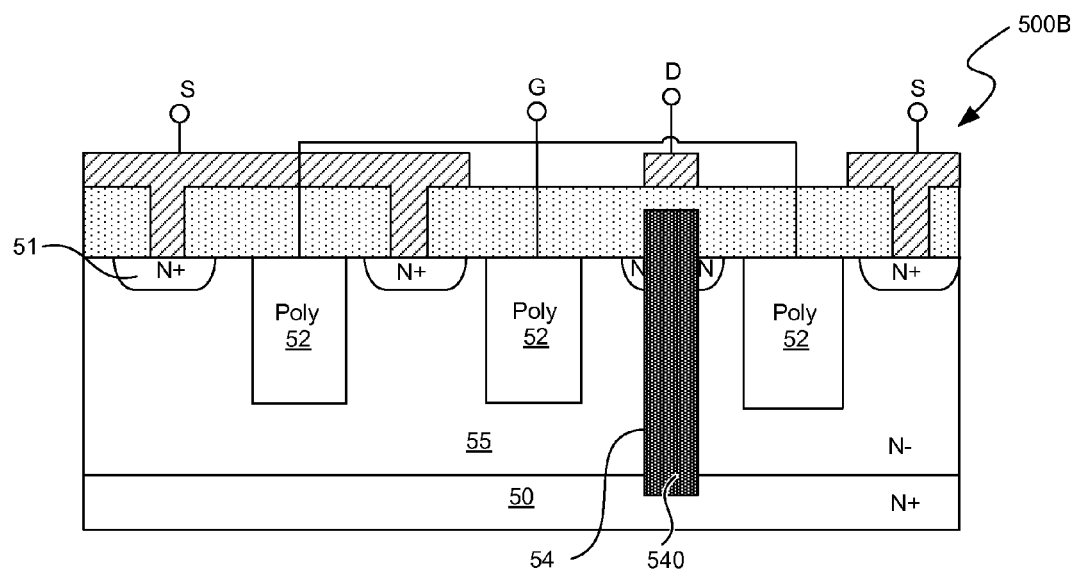
FIG. 5B illustrates a cross-sectional view of a JFET with trench contacts in accordance with additional embodiments of the present technology.

As another embodiment of the present technology, the vertical device is a vertical JFET as illustrated in FIG. 5A and FIG. 5B. The vertical JFET 500 comprises a backside substrate 50 functioning as the drain, highly N doped source regions 51, gate region/regions 52 and at least one trench 54 made from the topside reaching the substrate 50. The trench/trenches 54 are filled with conducting material such as tungsten 540 to connect the substrate 50 to the topside surface. The vertical JFET 500 further comprises N− epitaxial layers 55 on the substrate 50 where the gate regions 52 and the source regions 51 are formed in the N− epitaxial layers 55.

When the gate regions 52 are floated during normal operation, there are conducting paths from the source regions 51 to the substrate 50, and if a positive or negative voltage of VDS is applied, current flows from the source regions 51 to the drain 50 or from the drain 50 to the source regions 51. When the gate regions 52 are applied with a negative VGD, the N type epitaxial layer 55 regions near the gate regions 52 are depleted and the conduction resistance RON between the source and the drain increases. When the voltage at the gate regions 52 is negative enough, the conduction paths are pinched off entirely. The trench contacted topside drain adds on substantially small resistance to the vertical JFET 500 during normal operation.

In one embodiment, the trench 54 is made in the N+ regions and between two gate regions 52 for the semiconductor device 500B as shown in FIG. 5B. For this embodiment, the masks used in photolithography for manufacturing the source regions 51 and gate regions of the semiconductor device 500B can share the same masks for a vertical JFET without a topside drain.

Figure 6:
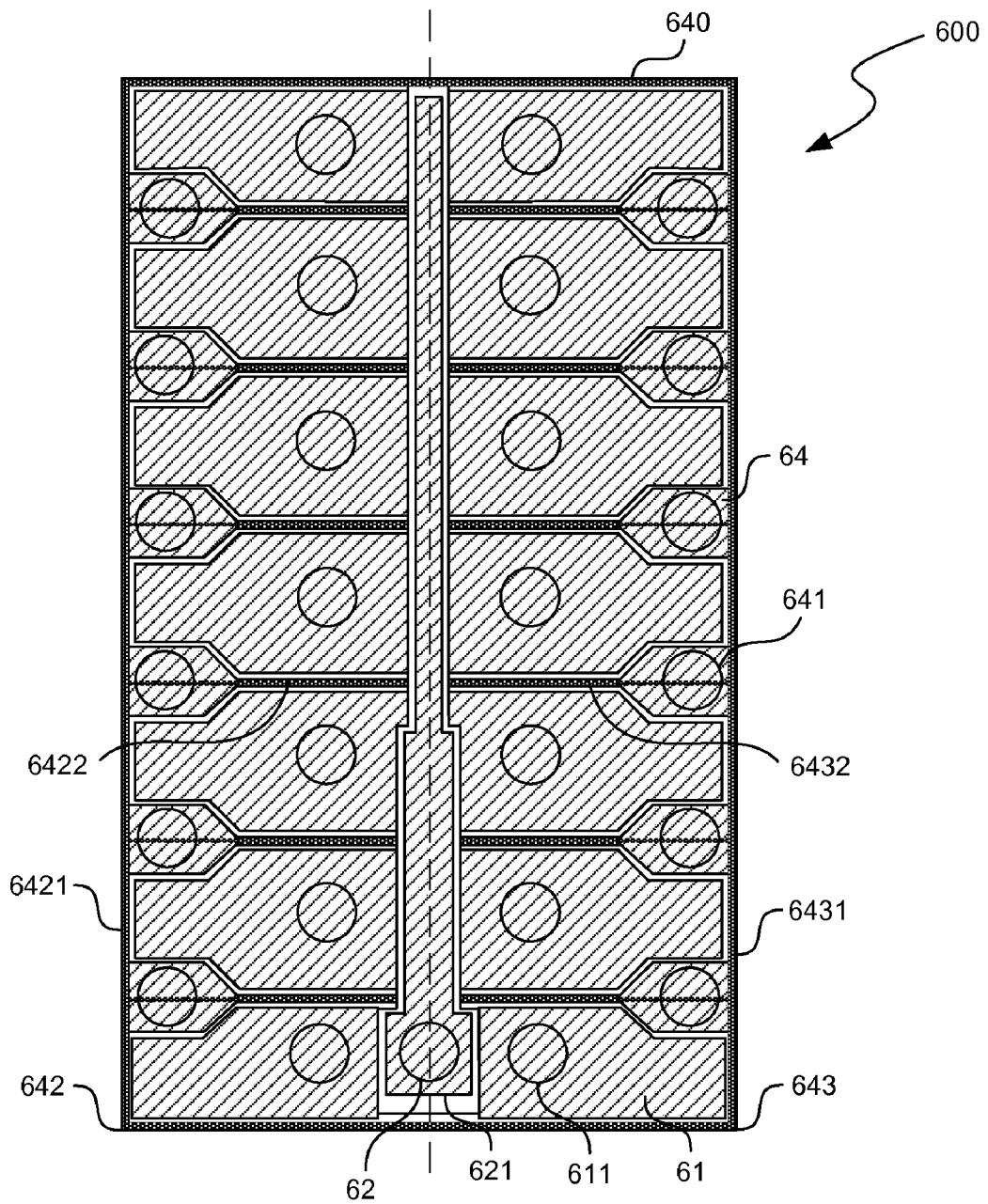
FIG. 6 illustrates a layout diagram of a vertical semiconductor device in accordance with embodiments of the present technology.

A topside layout diagram of a semiconductor device 600 in accordance with one embodiment of the present technology is shown in FIG. 6. In one embodiment, the vertical device 600 is the VDMOS 400 in FIG. 4A. In another embodiment, the vertical device 600 is the vertical JFET 500 in FIG. 5A. The vertical device 600 can also be another vertical discrete device with backside drain or cathode. As shown in FIG. 6, the topside layout of the vertical device 600 comprises the gate plate 62, the multiple source plates 61 and the drain plate 64. Compared to the layout diagram in FIG. 2, the layout of the semiconductor device 600 further comprises drain plate 64 in a bi-comb pattern at the surrounding of the layout and the source plate is divided into multiple separate banks of source plates 61.

The gate plate 62, the source plates 61 and the drain plate 64 are made of metal such as copper. The gate plate 62 is connected to the gate region/regions of the vertical device 600. The source plates 61 are each connected to a source region of the vertical device 600 in one embodiment. In other words, the source regions are also divided into multiple N+ source regions accordingly below the source plates 61. The drain plate 64 is connected to the substrate drain of the vertical device 600 through trench/trenches filled with conducting material such as tungsten. The gate plate 62, the source plates 61 and the drain plate 64 are connected to the gate region/regions, the source regions and tungsten of the vertical device 600 respectively through interconnections in one embodiment. The gate plate 62, the source plates 61 and the drain plate 64 compose part of the interconnections in another embodiment.

Continuing with FIG. 6, below the drain plate 64, trench/trenches 640 depicted in the filling pattern of dark gray are made reaching into the substrate of the vertical device 600 and are filled with tungsten in one embodiment. Thus, the substrate of the vertical device 600 is shorted by tungsten to the topside drain plate 64. In the embodiment as shown in FIG. 6, the trench/drain plate 64 is made in a pattern of bi-comb comprising two comb shaped patterns 642 and 643. The left side comb shaped pattern 642 has a left edge line 6421 and multiple fingers shaped structures 6422 unilaterally extending from the left edge line 6421 to the gate plate 62 and not reaching the region of gate plate 62. The right side comb shaped pattern 643 has a right edge line 6431 and multiple fingers shaped structures 6432 unilaterally extending from the right edge line 6431 to the gate plate 62 and not reaching the region of gate plate 62. The two comb shaped patterns 642 and 643 are connected together as a closed loop in the shown embodiment. The trench 64 is filled with tungsten, thus, the drain at the backside substrate of the vertical device 600 is connected to the topside surface. With the tungsten filled trench 64 spreading throughout the whole layout in a bi-comb pattern as one example, the area added on is little and the resistance is low, and the drain is connected to the topside surface with low RON*AREA. In one practical example as shown in FIG. 4A and FIG. 6, the die area is as low as about 33% of the die area of the diffusion solution.

Continuing with FIG. 6, on the drain plate 64, drain contact pads 641 are formed at the chip edge for wire bonding in one embodiment, with one drain contact pad 641 formed on each finger of the bi-comb pattern of the drain plate 64. Also, on each bank of the source plates 61, a source contact pad 611 is formed for wire bonding. And gate contact pad 621 is formed on the gate plate 62 for wire bonding. The contact pads 641, 611 and 621 can also connect the lead frame or other part through bumping balls in another embodiment. With the trench contacted topside drain spread throughout the layout, the source is divided into discrete banks by the drain plate/trench 64 as shown.

It is believed that a conventional VDMOS with 30V breakdown voltage with backside drain contact has a typical RON*AREA of 7-15 milliohm·mm2 depending on various factors such as capacitance requirements, unclamped inductive switching requirements, etc. An LDMOS or typical VDMOS with topside drain through deep diffusion solution has a typical RON*AREA of 25 to 35 milliohm·mm2. And for the vertical VDMOS with trench contacted topside drain filled with tungsten as shown in FIG. 4A, the RON*AREA is in the range of 10-25 milliohm·mm2, which is much lower than that of the LDMOS and the deep diffusion solution.

Figure 2:
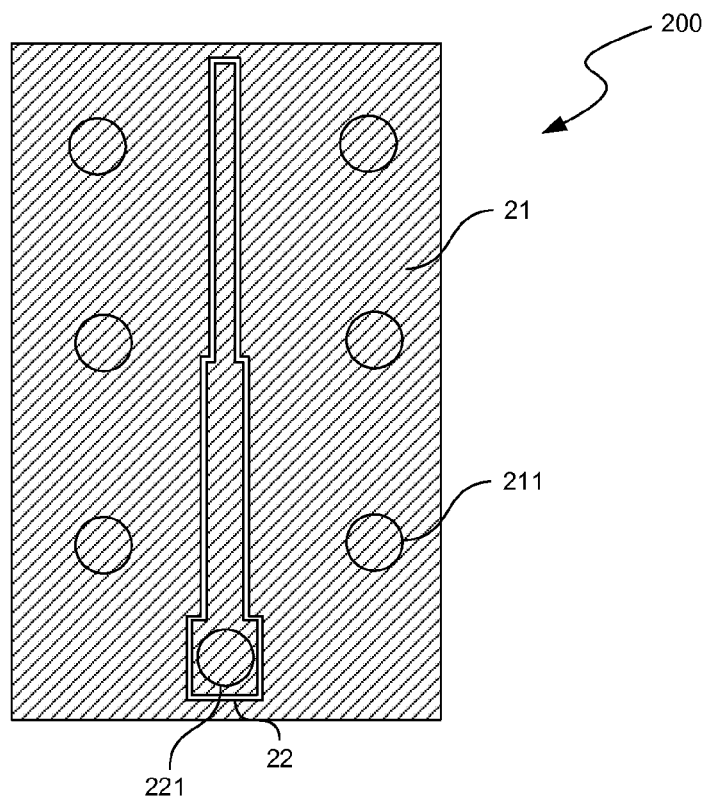
FIG. 2 illustrates a layout diagram of the conventional vertical MOSFET in FIG. 1A.

As an example, referring to FIG. 2, the area of a vertical discrete FET is about 2 mm2, the resistance of the VDMOS is 5 milliohm, and the RON*AREA of the vertical MOSFET is 10 milliohm·mm2. Referring to FIG. 5, each bank of source is roughly 75 milliohms. The resistance of the N+ substrate and the vertical trench for each block is roughly 35-40 milliohms. The total RON for each block is therefore on the order of 110-115 milliohms instead of 75 milliohms where the N+ substrate and the vertical trench constitute about 50% RON*AREA loss. The area lost due to the drain plate and drain pad is about 15-20%. So the total RON*AREA loss is about 70%. Therefore, in this example, converting a 10 milliohm·mm2, 30V discrete vertical FET to a top surface drain discrete FET by the method of using narrow trenches to contact the N+ substrate would result in roughly a 17 milliohm·mm2 discrete FET.

The layout in FIG. 6 is only for illustration purposes. The drain plate 64 can have any number of fingers. In another example, the layout in FIG. 6 is only a portion of a whole layout which comprises multiple repeated patterns of the structures shown in FIG. 6 in accordance with another embodiment of the present technology.

Figure 7A:
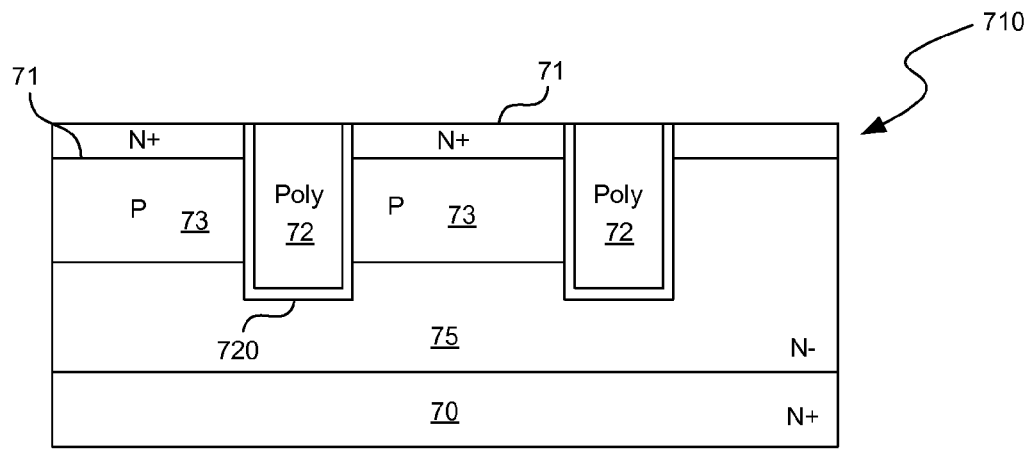
FIGS. 7A-7E illustrate a manufacturing process for forming a vertical semiconductor device with trench contacts in accordance with additional embodiments of the present technology.

FIGS. 7A to 7E show a manufacturing process of a vertical device with trench contacted topside drain according to one embodiment of the present technology. In FIG. 7A, a vertical semiconductor device 710 is manufactured. The vertical device can be any device with a backside substrate functioning as the drain or cathode of the device, such as VDMOS, vertical JFET or vertical FET with a backside cathode.

The vertical semiconductor device 710 in FIG. 7A is illustrated as a trench gate VDMOS. The VDMOS comprises an N+ substrate 70 functioning as the drain. On the substrate 70, an N− epitaxial layer 75 is formed. In the N-epitaxial layer 75, P type body regions 73, N+ source regions 71 and trench gate regions 72 filled with polysilicon are formed. Each gate region 72 is separated from the body region 73 and the epitaxial layer 75 by an oxide layer 720.

In one embodiment, the process further comprises manufacturing an N− epitaxial layer 75 on the N+ substrate 70; etching from the topside surface of the epitaxial layer 75 to form trenches for gate 72; growing oxide layers 720 onto the sidewalls of the trenches; filling polysilicon into the trenches to form the gate regions 72; diffusing P type substance to form the body regions 73. The body regions 73 do not extend below the gate regions 72 and are adjacent to the gate oxide layers 720 of the gate regions 72; diffusing N type substance extend into the body regions at the surface area to form the N+ source regions 71. In one embodiment, as is shown in FIG. 7E, the body regions 73 and the source regions 71 are shorted by a trench made contact.

Figure 7B:
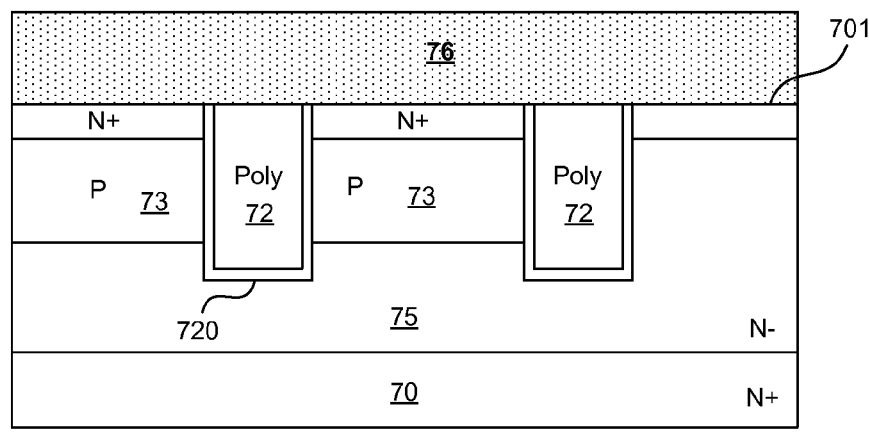
Figure 7C:
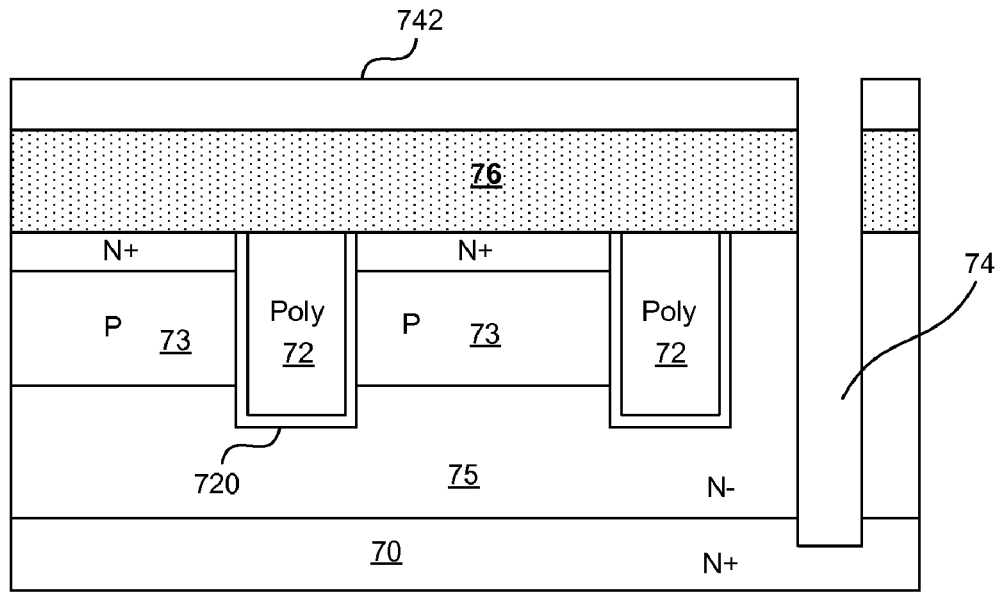

As shown in FIG. 7B, dielectric layer 76 is formed on the topside surface 701. As shown in FIG. 7C, photoresist 742 is coated on the semiconductor device and is then patterned with one additional mask to form openings for the trench 74. The N− epitaxial layer 75 is etched anisotropically through the openings into narrow and deep trench 74 reaching the N+ substrate 70. In another embodiment, hard mask such as nitride or oxide layer is adopted. After the hard mask is masked and patterned, the epitaxial layer 75 and part of the substrate 70 are etched anisotropically through the openings of the hard mask. The topside pattern of the trench 74 is bi-comb pattern as shown in FIG. 6 in one embodiment. The anisotropic etching can be Deep Reactive Ion Etching (DRIE) in one embodiment.

Figure 7D:
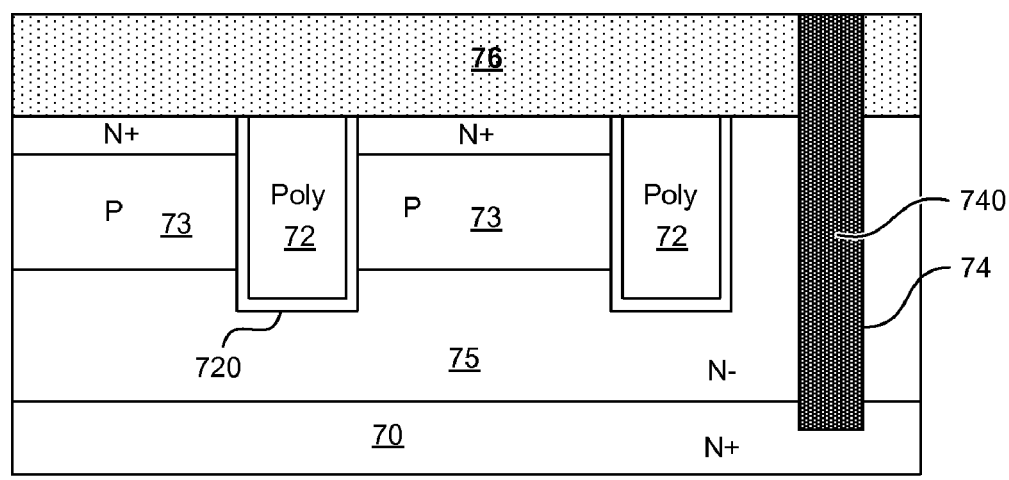

As shown in FIG. 7D, the trench 74 is filled with a conducting material 740. The conducting material 740 includes tungsten in one particular embodiment. In one embodiment, tungsten is deposited to fill the etched trench 74 and also on the surface of the dielectric layer 76. Then the tungsten on the dielectric layer 76 is removed either by tungsten etch or by chemical mechanical polish (CMP). Trench filled tungsten 740 is used to electrically connect the drain of the backside substrate 70 to the topside surface. In an alternative embodiment, the trench 74 is formed and conducting material is filled into the trench 74 before forming the dielectric layer 76.

Figure 7E:
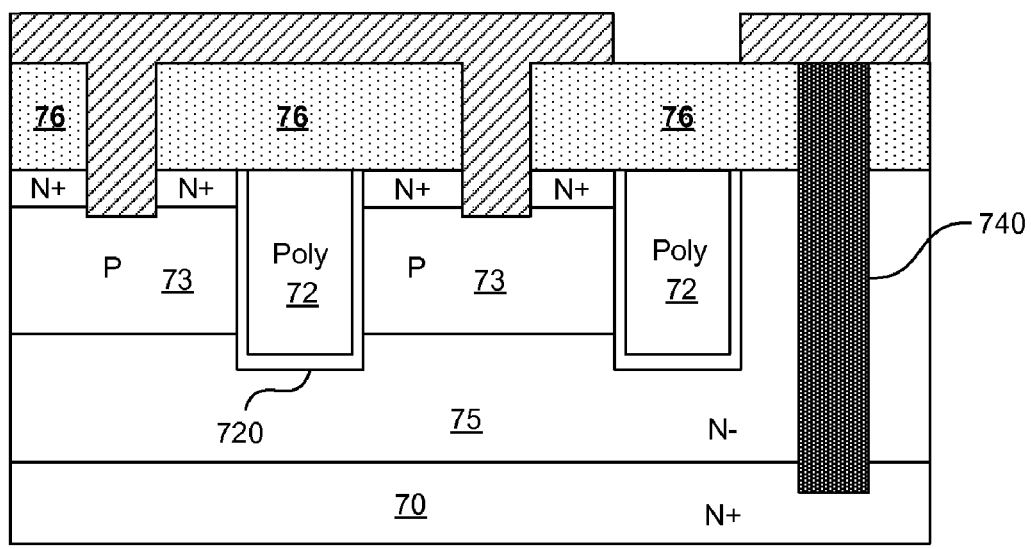

As shown in FIG. 7E, another mask is used to form the contacts and interconnections. After photolithography, the interlayer dielectric layer 76 is etched. In the illustrated embodiment, the N+ regions 71 are further etched to form the contacts reaching into the P body regions 73. In one embodiment, tungsten is deposited into the etched trenches to form the contacts which electrically short the body regions 73 and the source regions 71. Then metal is filled and etched to form the interconnections and the electrode plates. The electrode plates including the gate plate, source plates and drain plate as shown in FIG. 6 electrically contact the gate region, the source regions and the conducting material filled in the trench 74 respectively. In one embodiment, the manufacturing process of the vertical device further comprises the step of forming contact pads onto the gate plate, source plates and drain plate respectively.

The embodiment shown in FIG. 7A to FIG. 7E use only one additional mask to fulfill the topside drain of a vertical device which adds on low cost while maintaining low RON*AREA. Though "region" or "regions", "trench" or "trenches", "pad" or "pads" and other similar terms are referred in the description with singular or plural forms, it is not confined to the singular or plural numbers, and any number is considered in the embodiments. The embodiments shown in the figures adopt N type device, however, P type devices are also considered in the present technology. For a P type device, the dopant types are opposite to an N type device which is obvious to the person skilled in the art.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

I claim:

1. A semiconductor device, comprising:
   a vertical device with a substrate at a backside and a topside opposite the backside, wherein the substrate functions as a drain and wherein the vertical device has a drain plate at the topside; and
   a trench extending from the topside to the backside substrate, the trench being filled with a conducting material, and wherein the trench electrically connects the substrate to the drain plate.

2. The semiconductor device of claim 1, wherein the conducting material is tungsten.

3. The semiconductor device of claim 1, wherein the vertical device is a vertical MOSFET.

4. The semiconductor device of claim 1, further comprising a plurality of source regions with a first dopant type and at least one gate region at the topside, and wherein the substrate is of the first dopant type.

5. The semiconductor device of claim 4, further comprising:
   an epitaxial layer of the first dopant type on the substrate;
   a plurality of body regions of a second dopant type; and
   wherein the body regions and the trench are formed in the epitaxial layer, and the source regions are individually formed in one of the body regions.

6. The semiconductor device of claim 5, wherein the gate is a trench gate formed in the epitaxial layer, the gate being lined with an oxide layer and filled with polysilicon.

7. The semiconductor device of claim 5, further comprising a plurality of contacts extending into the body regions, wherein the source regions and the body regions are shorted by the contacts.

8. The semiconductor device of claim 4, wherein the trench is in a bi-comb pattern.

9. The semiconductor device of claim 1, further comprising:
   a gate plate at the topside; and
   multiple source plates at the topside.

10. The semiconductor device of claim 9, wherein the drain plate is in a bi-comb pattern.

11. The semiconductor device of claim 9, wherein the drain plate has multiple drain contact pads individually corresponding to one finger of the bi-comb pattern.

12. The semiconductor device of claim 9, wherein each gate plate is electrically shorted to a gate region, and wherein each drain plate is electrically shorted to the conducting material, and further wherein each of the source plates is electrically shorted to a source region.

13. The semiconductor device of claim 1, wherein the vertical device is a vertical JFET.

14. The semiconductor device of claim 1, wherein the vertical device is a vertical FET with integrated Schottky diode.

* * * * *